US012740088B2

(12) United States Patent
Cheng

(10) Patent No.: US 12,740,088 B2
(45) Date of Patent: Sep. 15, 2026

(54) ENHANCEMENT MODE SWITCHING DEVICES AND MANUFACTURING METHODS THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 517 days.

(21) Appl. No.: 18/319,428

(22) Filed: May 17, 2023

(65) Prior Publication Data

US 2023/0387284 A1 Nov. 30, 2023

(30) Foreign Application Priority Data

May 31, 2022 (CN) ........................ 202210629327.X

(51) Int. Cl.

| | |
|---|---|
| ***H10D 30/47*** | (2025.01) |
| ***H10D 30/01*** | (2025.01) |
| ***H10D 62/85*** | (2025.01) |
| ***H10D 64/01*** | (2025.01) |
| ***H10D 64/27*** | (2025.01) |

(52) U.S. Cl.

CPC ......... *H10D 30/475* (2025.01); *H10D 30/015* (2025.01); *H10D 62/8503* (2025.01); *H10D 64/01* (2025.01); *H10D 64/411* (2025.01)

(58) Field of Classification Search

CPC .. H10D 30/475; H10D 62/8503; H10D 64/01; H10D 30/015; H10D 64/411

USPC ........................................................... 257/76

See application file for complete search history.

(56) References Cited

U.S. PATENT DOCUMENTS

| | | | | |
|---|---|---|---|---|
| 2021/0202728 A1* | 7/2021 | Nongaillard | ......... | H10D 30/015 |
| 2023/0299190 A1* | 9/2023 | Bisi | .......................... | H10D 8/60 257/76 |

FOREIGN PATENT DOCUMENTS

| | | | |
|---|---|---|---|
| CN | 110100313 B | 11/2020 | |
| WO | WO-2020252626 A1 * | 12/2020 | ........... H10D 64/311 |

* cited by examiner

*Primary Examiner* — Norman D Richards
*Assistant Examiner* — Colin Russell Mccutcheon
(74) *Attorney, Agent, or Firm* — Carroll, Hoette & Butscher, LLC; Christopher R. Carroll

(57) ABSTRACT

The present disclosure provides enhancement mode switching devices and manufacturing methods thereof. The enhancement mode switching device includes a substrate; a channel structure including a channel layer and a barrier layer. The channel layer is provided on the substrate, and the barrier layer is provided on a side of the channel layer far away from the substrate. A side of the channel structure far away from the substrate is provided with a trench in a gate region, and the trench penetrates through the barrier layer and a part of the channel layer. The enhancement mode switching device includes a p-type semiconductor layer in the gate region, a gate electrode on a side of the p-type semiconductor layer far away from the substrate, a source electrode in the source region, and a drain electrode in the drain region. At least part of the p-type semiconductor layer is in the trench.

12 Claims, 6 Drawing Sheets

ENHANCEMENT MODE SWITCHING DEVICES AND MANUFACTURING METHODS THEREOF

CROSS REFERENCE TO RELATED APPLICATIONS

This application claims priority to Chinese Patent Application No. 202210629327.X filed on May 31, 2022, the entire content of which is incorporated herein by reference.

TECHNICAL FIELD

This present disclosure relates to the field of semiconductor technologies, and in particular, to enhancement mode switching devices structures and manufacturing methods thereof.

BACKGROUND

Materials of gallium nitride (GaN) have stable chemical properties, such as characteristics of high temperature resistance and corrosion resistance, and have inherent advantages in high frequency, high power, and radiation resistance applications. High electron mobility transistors (HEMTs) based on AlGaN/GaN heterojunctions have been widely used in the semiconductor field. This type of devices has the characteristics of high reverse blocking voltage, low forward conduction resistance, and high operating frequency, so this type of devices can meet the system's requirements for higher power, higher frequency, and smaller size of semiconductor devices.

In order to realize the enhancement mode type HEMT, process of a P-type gate is commonly used. In order to enhance the control ability of the gate for the two-dimensional electron gas, it is necessary to reduce the distance between the P-type gate and the two-dimensional electron gas. In fact, there are electron capture centers at materials of channel layer and barrier layer and at various contact surfaces. The hot electron capture process of the device is very significant when the device operates at high voltage and high current, and the related current collapse effect and dynamic resistance characteristic degradation are very serious. How to solve the current collapse effect and improve the control ability of gate electrode has become a problem that needs to be solved urgently.

SUMMARY

Enhancement mode switching devices and manufacturing methods thereof are provided in the present disclosure.

According to an aspect of the present disclosure, an enhancement mode switching device is provided, including:

- substrate;
- a channel structure, including a channel layer and a barrier layer, where the channel layer is provided on the substrate, and the barrier layer is provided on a side of the channel layer far away to the substrate; the side of the channel structure far away from the substrate is provided with a trench, the trench penetrates through the barrier layer and a part of the channel layer; the channel structure includes a source region, a drain region, and a gate region between the source region and the drain region; the trench is in the gate region;
- a p-type semiconductor layer, provided in the gate region, where at least part of the p-type semiconductor layer is located in the trench and is in contact with the channel layer;
- a gate electrode, located on a side of the p-type semiconductor layer far away from the substrate;
- a source electrode, located in the source region;
- a drain electrode, located in the drain region;

Further, the channel layer is an n-type semiconductor; or a part of the channel layer exposed by the trench is an n-type semiconductor.

Further, the enhancement mode switching device further includes:

- an n-type semiconductor layer, covering a bottom wall of the trench, where the p-type semiconductor layer is provided on the n-type semiconductor layer.

Further, the enhancement mode switching device further includes:

- an n-type semiconductor layer, covering a bottom wall and side walls of the trench, where the p-type semiconductor layer is provided on the n-type semiconductor layer.

Further, the material of the n-type semiconductor layer is selected from one or more of n-type GaN, n-type AlGaN, or n-type InGaN.

In addition, a doping concentration of p-type doped ions in the p-type semiconductor layer 4 is varied, and a variation pattern of the doping concentration of the p-type doped ions varying from bottom to up includes one of or a combination of two or more of the following variation patterns: gradual increasing, gradual decreasing, stepwise increasing, stepwise decreasing, or periodic changing.

Further, the material of the p-type semiconductor layer is selected from one or more of p-type GaN, p-type AlGaN, or p-type InGaN.

Further, the p-type semiconductor layer includes at least one element with changing composition, the element with changing composition varies in the epitaxial direction, and a variation curve of the content of the element with changing composition in the epitaxial direction includes one of or a combination of two or more of the following variation stages: periodic variation, increasing variation or decreasing variation.

Further, the p-type semiconductor layer adopts a periodic structure, and the periodic structure includes at least one period stacked in sequence along the epitaxial direction, where each of the at least one period includes a first periodic layer and a second periodic layer that are sequentially stacked along the epitaxial direction;

- the content of the element with changing composition increases uniformly in the first periodic layer and decreases uniformly in the second periodic layer; or
- the content of the element with changing composition decreases uniformly in the first periodic layer and increases uniformly in the second periodic layer; or
- a first content of the element with changing composition is constant in the first periodic layer, and a second content of the element with changing composition is constant in the second periodic layer, wherein the first content is higher or lower than the second content; or
- the content of the element with changing composition increases uniformly in the first periodic layer and is constant in the second periodic layer; or
- the content of the element with changing composition decreases uniformly in the first periodic layer and is constant in the second periodic layer.

Further, the trenches are a plurality of discrete trenches.

Further, the enhancement mode switching device further includes:

a cap layer, where the cap layer is provided on the side of the barrier layer far away from the substrate, and the cap layer is provided with an opening connecting with the trench.

Further, the enhancement mode switching device further includes:

a cap layer, where the cap layer is provided on the side of the barrier layer far away from the substrate, the cap layer is provided with an opening connecting with the trench, the cap layer and the n-type semiconductor layer are integrally formed, and n-type ions doping concentration in the cap layer is lower than n-type ions doping concentration in the n-type semiconductor layer.

Further, where a part of the p-type semiconductor layer covers a part which the channel structure is outside the trench, the enhancement type switching device further includes:

a cap layer, where the cap layer is provided on the side of the p-type semiconductor layer far away from the substrate, and the cap layer has a through-hole corresponding to the trench, a region of the p-type semiconductor layer corresponding to the through-hole is in an active state, and other region of the p-type semiconductor layer is in a passive state.

According to an aspect of the present disclosure, a manufacturing method of enhancement mode switching device is provided, including:

providing a substrate;

forming a channel structure, where the channel structure includes a channel layer and a barrier layer, the channel layer is provided on the substrate and the barrier layer is provided on a side of the channel layer far away from the substrate; the channel structure includes a source region, a drain region, and a gate region between the source region and the drain region;

providing a trench on the side of the channel layer far away from the substrate, where the barrier layer and a part of channel layer are penetrated through by the trench; the trench is located in the gate region;

forming a p-type semiconductor layer in the gate region, where at least part of the p-type semiconductor layer is in the trench;

forming a gate electrode on the side of the p-type semiconductor layer far away from the substrate; forming a source electrode in the source region; forming a drain electrode in the drain region.

Further, forming the n-type semiconductor layer includes:

forming an n-type semiconductor layer and a cap layer simultaneously by a process of one step, where the cap layer is provided on the side of the barrier layer far away from the substrate, and the cap layer is provided with an opening connecting with the trench, n-type ions doping concentration of in the cap layer is lower than n-type ions doping concentration in the n-type semiconductor layer.

Further, where a part of the p-type semiconductor layer covers a part which the channel structure is outside the trench, the manufacturing method of enhancement type switching device further includes:

activating a region of the p-type semiconductor layer corresponding to the trench and passivating other region of the p-type semiconductor layer;

forming a cap layer on the side of the p-type semiconductor layer far away from the substrate, where the cap layer has a through-hole corresponding to the trench to expose the region of the p-type semiconductor layer in an active state.

Figure 1:
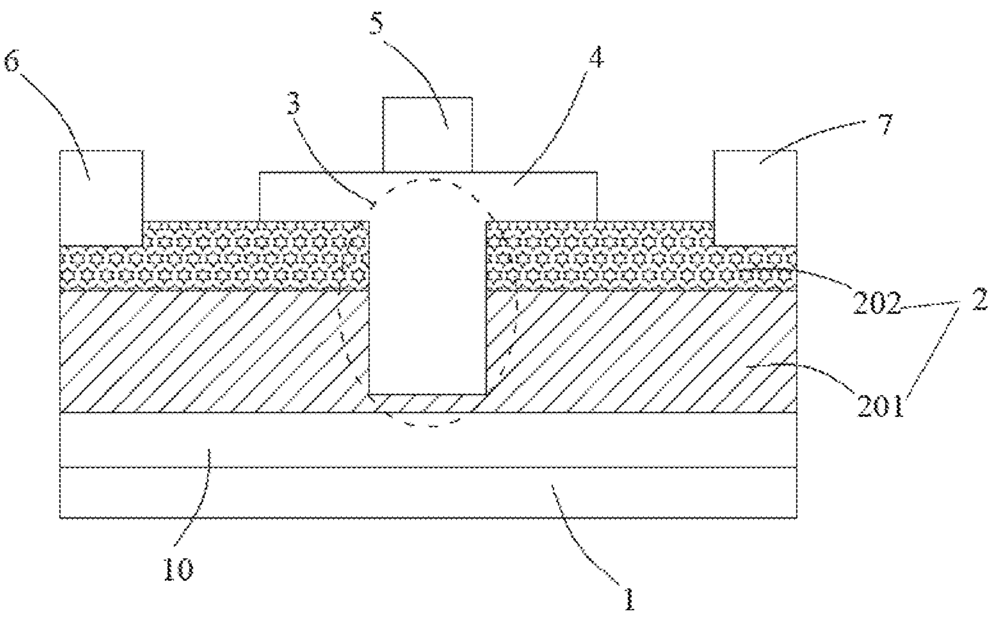
FIG. 1 is a schematic diagram of an enhancement mode switching device according to embodiment 1 of the present disclosure.

Description of reference signs: 1 substrate; 2 channel structure; 201 channel layer; 202 carrier layer; 3 trench; 4 p-type semiconductor layer; 401 first part; 402 second part; 5 gate electrode; 6 source electrode; 7 drain electrode; 8 n-type semiconductor layer; 9 back barrier layer; 10 buffer layer; 11 cap layer; 12 through-hole; 13 heavily doped n-type nitride semiconductor.

DETAILED DESCRIPTION

Exemplary embodiments will be described in detail here, and examples thereof are shown in the drawings. When the following description refers to the drawings, unless otherwise indicated, the same numerals in different drawings refer to the same or similar elements. The embodiments described in the following exemplary embodiments do not represent all embodiments consistent with the present disclosure. Rather, they are merely examples of devices consistent with some aspects of the present disclosure as detailed in the appended claims.

Embodiment 1

Embodiment 1 of the present disclosure provides an enhancement mode switching device and a manufacturing method of the enhancement mode switching device. FIG. 1 is a schematic diagram of an enhancement mode switching device according to embodiment 1 of the present disclosure.

The enhancement mode switching device may include a substrate 1, a channel structure 2, a p-type semiconductor layer 4, a gate electrode 5, a source electrode 6, and a drain electrode 7.

The channel structure 2 includes a channel layer 201 and a barrier layer 202. The channel layer 201 is provided on the substrate 1. The barrier layer 202 is provided on the side of the channel layer 201 far away from the substrate 1. The side of the channel structure 2 far away from the substrate 1 is provided with a trench 3. The trench 3 penetrates through the barrier layer 202 and a part of the channel layer 201. The channel structure 2 includes a source region, a drain region, and a gate region between the source region and the drain region. The trench 3 is located in the gate region. The p-type semiconductor layer 4 is provided in the gate region, and at least part of the p-type semiconductor layer 4 is located in the trench 3 and is in contact with the channel layer 201. The gate electrode 5 is located on the side of the p-type semiconductor layer 4 far away from the substrate 1. The source electrode 6 is located in the source region. The drain electrode 7 is located in the drain region.

In the enhancement mode switching device according to embodiment 1 of the present disclosure, the barrier layer 202 under the p-type semiconductor layer 4 is completely penetrated, the channel layer 201 is partially penetrated. The p-type semiconductor layer 4 and the channel layer 201 in contact with each other in the gate region form a space depletion region in the gate region, and the channel of electrons between the source electrode 6 and the drain electrode 7 of the switching device is interrupted. Therefore, the switching device can be effectively cut off under zero gate bias voltage. When a positive bias voltage is applied to the gate electrode 5 of the switching device, the p-type semiconductor layer and the channel layer in contact with each other in the gate region form a PN junction, which effectively suppresses the current collapse effect of the device, improves the dynamic characteristics, and improves the gate control ability and reliability and robustness of the device. The switching device of the present disclosure can improve the gate reliability of the device and has better resistance to avalanche, short circuit and surge.

Each part of the enhancement mode switching device according to embodiment 1 of the present disclosure will be described in detail below.

The substrate 1 may be a silicon substrate, a silicon carbide substrate, or a sapphire substrate or the like, which is not limited. In addition, the enhancement mode switching device of the present disclosure may further include a nucleation layer and a buffer layer 10 sequentially disposed on the substrate 1.

The channel structure 2 includes a channel layer 201 and a barrier layer 202. The band gap of the barrier layer 202 is larger than that of the channel layer 201. The channel layer 201 may be disposed on the side of the buffer layer 10 far away from the substrate 1, and the barrier layer 202 may be disposed on the surface of the channel layer 201 far away from the substrate 1. The channel layer 201 and the barrier layer 202 may constitute a heterojunction structure. Taking the GaN based material as an example, the material of channel layer 201 may be GaN, the material of barrier layer 202 may be AlGaN, and the channel layer 201 and the barrier layer 202 constitute a heterostructure to form a two-dimensional electron gas (2DEG). The channel layer 201 and the barrier layer 202 may also be made of other materials, such as GaAs based materials, the channel layer 201 is made of GaAs, and the barrier layer 202 is made of AlGaAs. Where, the barrier layer 202 may be an n-type semiconductor, which is not limited in the present disclosure. The channel layer 201 may be an n-type semiconductor; alternatively, a part of the channel layer 201 exposed by the trench 3 may be an n-type semiconductor. The p-type semiconductor layer and the n-type semiconductor layer in contact with each other in the gate region form a PN junction in the gate region. The PN junction has a space depletion region, and the channel of electrons between the source electrode and drain electrode of the switching device is interrupted. Therefore, the switching device can be effectively cut off under zero gate bias voltage to improve the gate control ability and reliability of the device.

Figure 2:
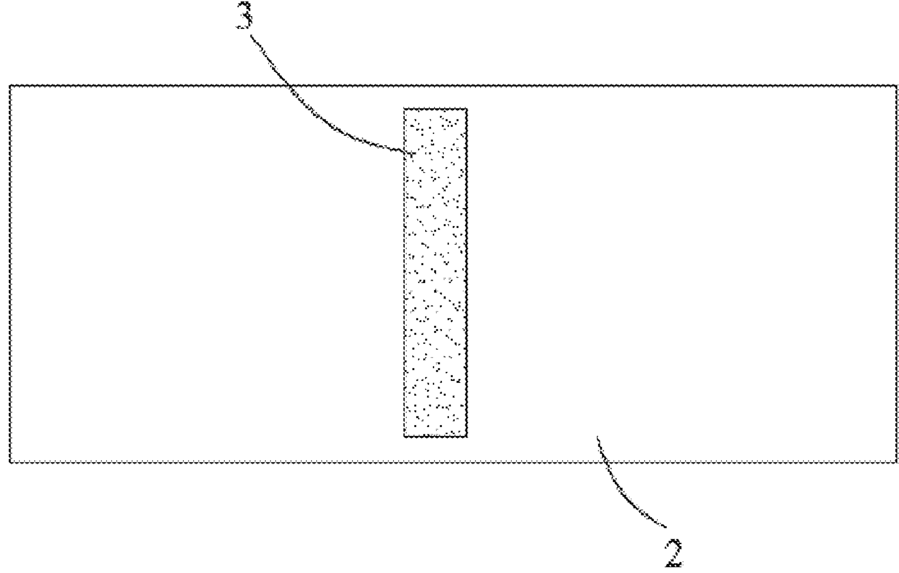
FIG. 2 is a top view of a trench in the enhancement mode switching device according to embodiment 1 of the present disclosure.
Figure 3:
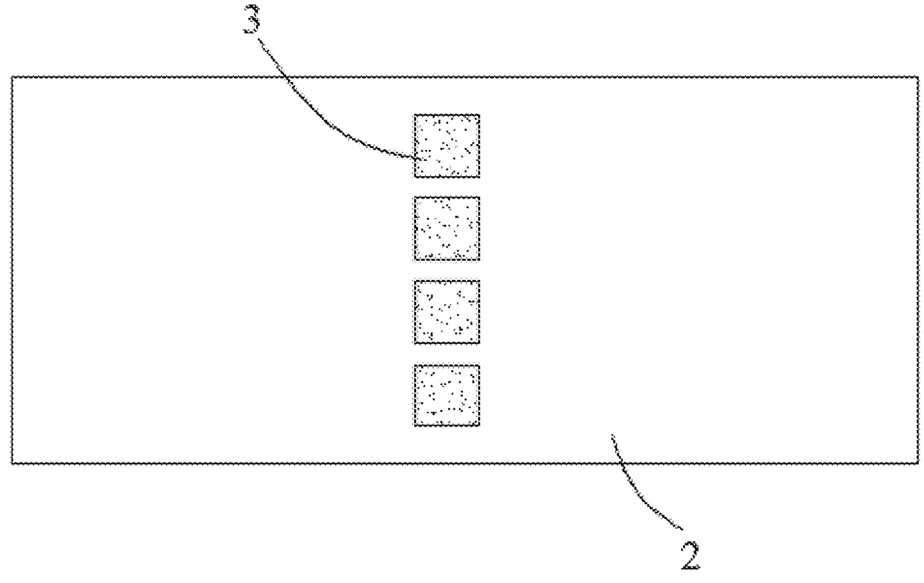
FIG. 3 is another top view of a trench in the enhancement mode switching device according to embodiment 1 of the present disclosure.

The channel structure 2 includes a source region, a drain region, and a gate region between the source region and the drain region. The source region, the drain region and the gate region may all be strip-shaped and provided parallel to each other, which is not particularly limited in the present disclosure. The side of the channel structure 2 far away from the substrate 1 is provided with a trench 3. The trench 3 penetrates through the barrier layer 202 and a part of the channel layer 201, that is, the sum of the thickness of the barrier layer 202 and the thickness of the channel layer 201 is greater than the depth of the trench 3, and the depth of the trench 3 is greater than the thickness of the barrier layer 202. As shown in FIG. 2, the trench 3 may be a strip trench; optionally, as shown in FIG. 3, the trenches 3 are a plurality of discrete trenches. However, the embodiments of the present disclosure are not particularly limited thereto. For example, the gate region is strip shape and the trench 3 is strip shape, the extending direction of the trench 3 may be the same as the extending direction of the gate region, and the orthographic projection of the trench 3 on the substrate 1 is in the orthographic projection region of the gate region on the substrate 1.

The p-type semiconductor layer 4 is provided in the gate region, that is, the orthographic projection of the p-type semiconductor layer 4 on the substrate 1 may be in the orthographic projection region of the gate region on the substrate 1. At least part of the p-type semiconductor layer 4 is located in the trench 3, for example, part of the p-type semiconductor layer 4 is located in the trench 3, that is, the p-type semiconductor layer 4 protrudes out of the trench 3; for another example, the entire of the p-type semiconductor layer 4 is located in the trench 3, that is, the p-type semiconductor layer 4 does not protrude out of the trench 3. The p-type semiconductor layer 4 is in contact with the channel layer 201. It should be noted that the "contact" described in the present disclosure includes not only direct contact, but also indirect contact.

The material of the p-type semiconductor layer 4 is selected from one or more of p-type GaN, p-type AlGaN, and p-type InGaN. In addition, a doping concentration of p-type doped ions in the p-type semiconductor layer 4 is varied, and a variation pattern of the doping concentration of the p-type doped ions varying from bottom to up includes one of or a combination of two or more of the following variation patterns: gradual increasing, gradual decreasing, stepwise increasing, stepwise decreasing, or periodic changing. The p-type semiconductor layer 4 includes at least one element with changing composition, the content of the element with changing composition varies in the epitaxial direction, and a variation curve of the content of the element with changing composition in the epitaxial direction includes one of or a combination of two or more of the following variation stages: periodic variation, increasing variation or decreasing variation. Further, the p-type semiconductor layer 4 may include a periodic structure, and the periodic structure includes at least one period stacked in sequence along the epitaxial direction, where each of the at least one period includes a first periodic layer and a second periodic layer that are sequentially stacked along the epitaxial direction. The content of the element with changing composition increases uniformly in the first periodic layer and decreases uniformly in the second periodic layer; or the content of the element with changing composition decreases uniformly in the first periodic layer and increases uniformly in the second periodic layer; or a first content of the element with changing composition is constant in the first periodic layer, and a second content of the element with changing composition is constant in the second periodic layer, where the first content is higher or lower than the second content; or the content of the element with changing composition increases uniformly in the first periodic layer and is constant in the second periodic layer; or the content of the element with changing composition decreases uniformly in the first periodic layer and is constant in the second periodic layer. In addition, the thickness of the first periodic layer may be greater than or equal to the thickness of the second periodic layer.

The gate electrode 5 is located on the side of the p-type semiconductor layer 4 far away from the substrate 1. The source electrode 6 is located in the source region. The drain electrode 7 is located in the drain region. Both the source electrode 6 and the drain electrode 7 form ohmic contact with the heterojunction structure. The materials of the gate electrode 5, the source electrode 6, and the drain electrode 7 may be metals, such as Ti/Al/Ni/Au, Ni/Au, and the like.

The manufacturing method of the enhancement mode switching device is used to manufacture the above enhancement mode switching device, and may specifically include steps S100 to S140, where:

Step S100: the substrate 1 is provided.

Step S110: a channel structure 2 is formed, where the channel structure 2 includes a channel layer 201 and a barrier layer 202, the channel layer 201 is provided on the substrate 1 and the barrier layer 202 is provided on a side of the channel layer 201 far away from the substrate 1; the channel structure 2 includes a source region, a drain region, and a gate region between the source region and the drain region.

Step S120: a trench 3 is provided on the side of the channel structure 2 far away from the substrate 1, the barrier layer 202 and a part of channel layer 201 are penetrated through by the trench 3; the trench 3 is located in the gate region.

Step S130: a p-type semiconductor layer 4 is formed in the gate region, where at least part of the p-type semiconductor layer is in the trench 3.

Step S140: a gate electrode 5 is formed on the side of the p-type semiconductor 4 far away from the substrate 1; a source electrode 6 is formed in the source region; a drain electrode 7 is formed in the drain region.

In step S110, the channel layer 201 and the barrier layer 202 may be prepared by epitaxial growth. In step S120, the trench 3 may be formed by etching. In step S130, the p-type semiconductor layer 4 may be prepared by epitaxial growth. In step S140, the gate electrode 5, the source electrode 6, and the drain electrode 7 may be formed by a physical vapor deposition method or a chemical vapor deposition method.

Embodiment 2

Figure 4:
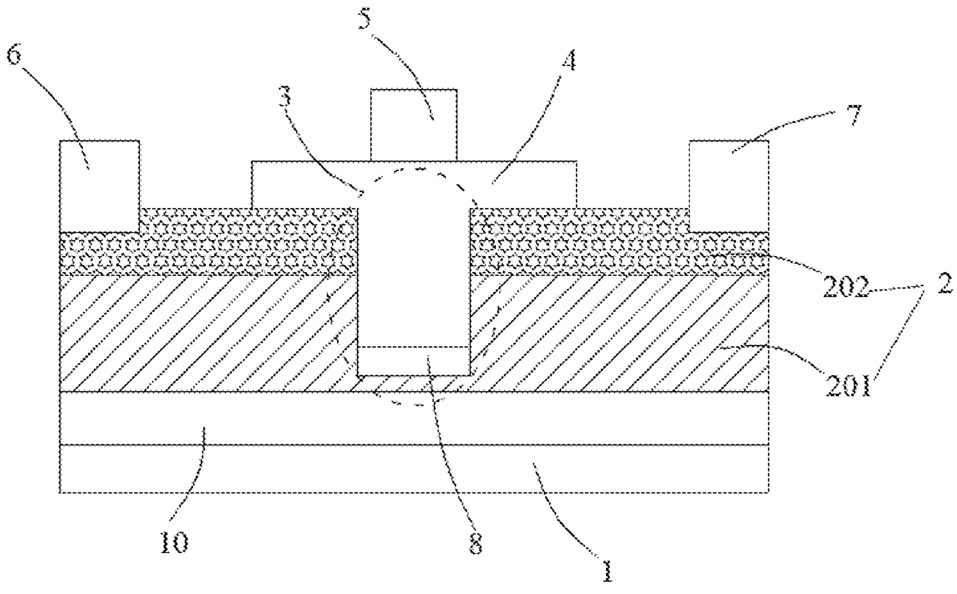
FIG. 4 is a schematic diagram of an enhancement mode switching device according to embodiment 2 of the present disclosure.

FIG. 4 is a schematic diagram of an enhancement mode switching device according to embodiment 2 of the present disclosure. A manufacturing method of the enhancement mode switching device and an enhancement mode switching device according to the second embodiment of the present disclosure is substantially the same as the manufacturing method of the enhancement mode switching device and the enhancement mode switching device according to the first embodiment of the present disclosure, except that the enhancement mode switching device may further include an n-type semiconductor layer 8, which covers the bottom wall of the trench 3, and the p-type semiconductor layer 4 is provided on the n-type semiconductor layer 8. The material of the n-type semiconductor layer 8 is selected from one or more of n-type GaN, n-type AlGaN and n-type InGaN. It should be noted that the n-type semiconductor layer 8 may be formed by epitaxial growth and formed before the formation of p-type semiconductor layer 4. The p-type semiconductor layer 4 and the n-type semiconductor layer 8 in contact with each other in the gate region form a PN junction, which can effectively suppress the current collapse effect of the device, improve the dynamic characteristics, and improve the gate control ability and reliability of the device. The switching device of the present disclosure can improve the gate reliability of the device and has better resistance to avalanche, short circuit and surge.

Embodiment 3

Figure 5:
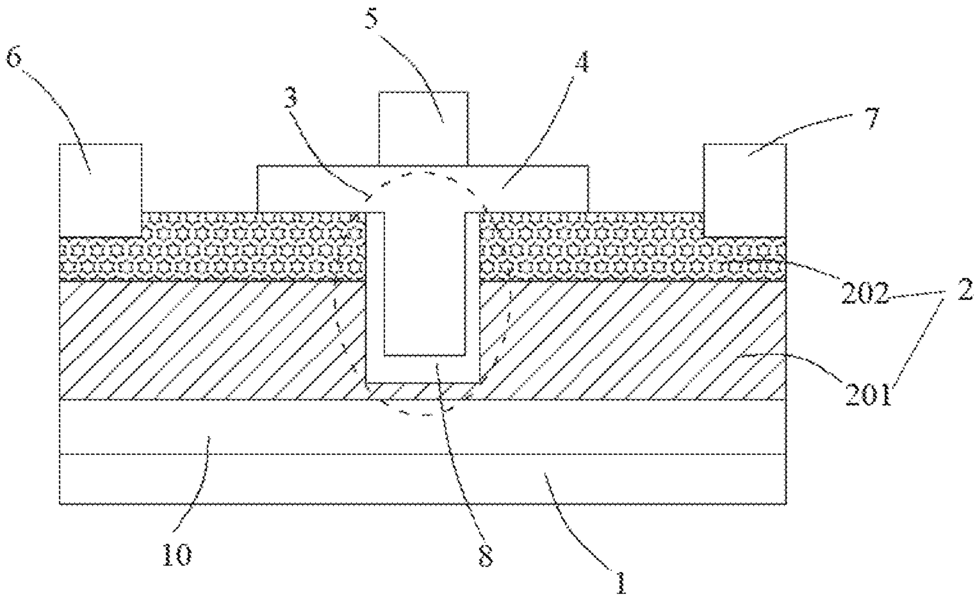
FIG. 5 is a schematic diagram of an enhancement mode switching device according to embodiment 3 of the present disclosure.

FIG. 5 is a schematic diagram of an enhancement mode switching device according to embodiment 3 of the present disclosure. A manufacturing method of the enhancement mode switching device and an enhancement mode switching device according to the third embodiment of the present disclosure is substantially the same as the manufacturing method of the enhancement mode switching device and the enhancement mode switching device according to the first embodiment of the present disclosure, except that the enhancement mode switching device may further include an n-type semiconductor layer 8, which covers the bottom wall and side walls of the trench 3, and the p-type semiconductor layer 4 is provided on the n-type semiconductor layer 8. The material of the n-type semiconductor layer 8 is selected from one or more of n-type GaN, n-type AlGaN, and n-type InGaN. It should be noted that the n-type semiconductor layer 8 may be formed by epitaxial growth and formed before the formation of the gate electrode 5. The n-type semiconductor layer 8 covering the bottom wall and the side walls of the trench 3 is connected to the channel structure 2 which is cut off by the trench 3, and the electron mobility in the channel structure 2 is significantly better than that in a channel of the Metal-Oxide-Semiconductor Field Effect Transistor (MOSFET), thereby the on-resistance of the device during operation is significantly reduced.

Embodiment 4

Figure 6:
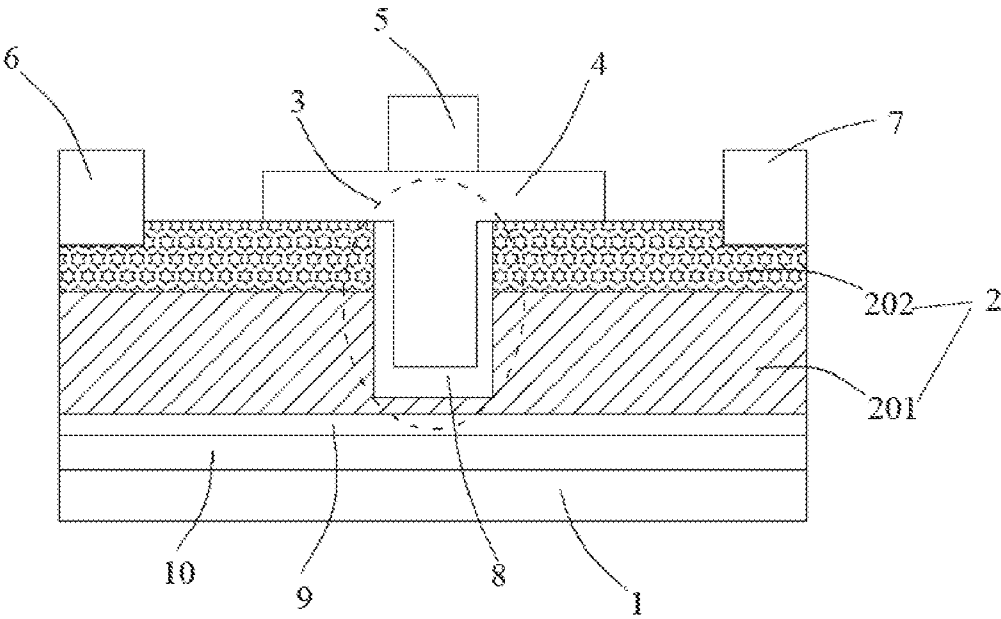
FIG. 6 is a schematic diagram of an enhancement mode switching device according to embodiment 4 of the present disclosure.

FIG. 6 is a schematic diagram of an enhancement mode switching device according to embodiment 4 of the present disclosure. A manufacturing method of the enhancement mode switching device and an enhancement mode switching device according to embodiment 4 of the present disclosure is substantially the same as the manufacturing method of the enhancement mode switching device and the enhancement mode switching device according to any one of embodiments 1 to 3 of the present disclosure, except that the enhancement mode switching device may further include a back barrier layer 9. The back barrier layer 9 is provided on the side of the channel layer 201 close to the substrate 1. The material of the back barrier layer 9 may be at least one of GaN, AlGaN, InGaN and AlInGaN. The back barrier layer 9 is an n-type semiconductor, and the n-type back barrier layer 9 can reduce the on-resistance when the switching device operates. The n-type back barrier layer 9 can be used as an etching stop layer when etching the trench, therefore the manufacturing process of the switching device is further simplified.

Embodiment 5

Figure 7:
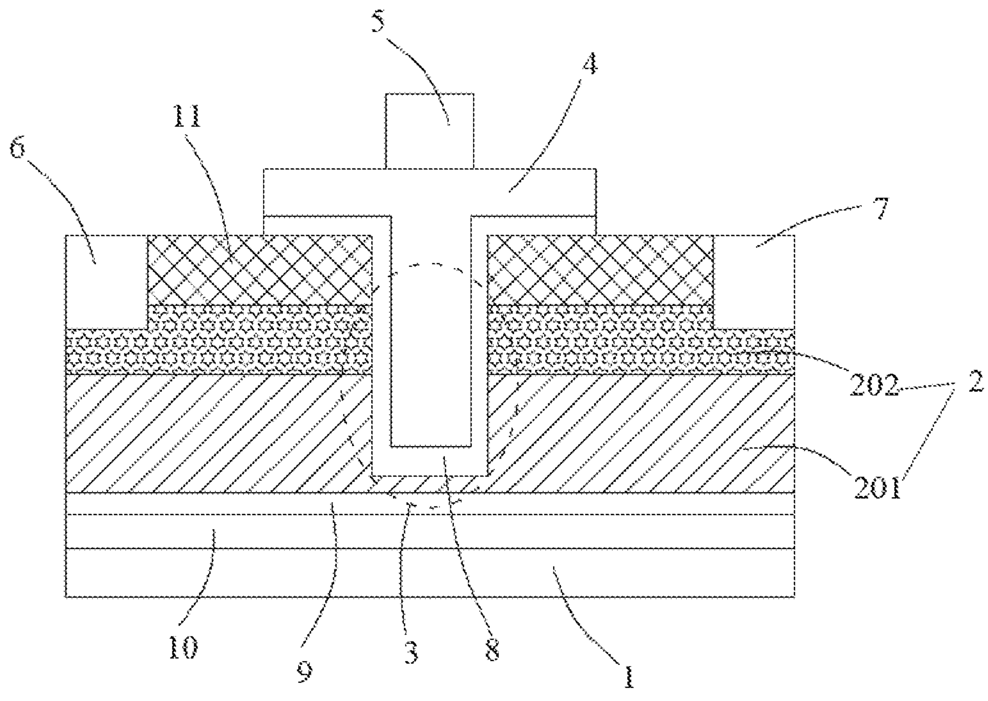
FIG. 7 is a schematic diagram of an enhancement mode switching device according to embodiment 5 of the present disclosure.

FIG. 7 is a schematic diagram of an enhancement mode switching device according to embodiment 5 of the present disclosure. A manufacturing method of the enhancement mode switching device and an enhancement mode switching device according to embodiment 5 of the present disclosure is substantially the same as the manufacturing method of the enhancement mode switching device and the enhancement mode switching device according to any one of embodiments 1 to 4 of the present disclosure, except that the enhancement mode switching device may further include a cap layer 11, where the cap layer 11 is provided on the side of the barrier layer 202 far away from the substrate 1, and the cap layer 11 is provided with an opening connecting with the trench 3. In addition, as an example, the enhancement mode switching device includes an n-type semiconductor layer 8 provided on the bottom wall and the side walls of the trench 3, and the n-type semiconductor layer 8 may cover the surface of the cap layer 11 far away from the substrate 1.

Embodiment 6

Figure 8:
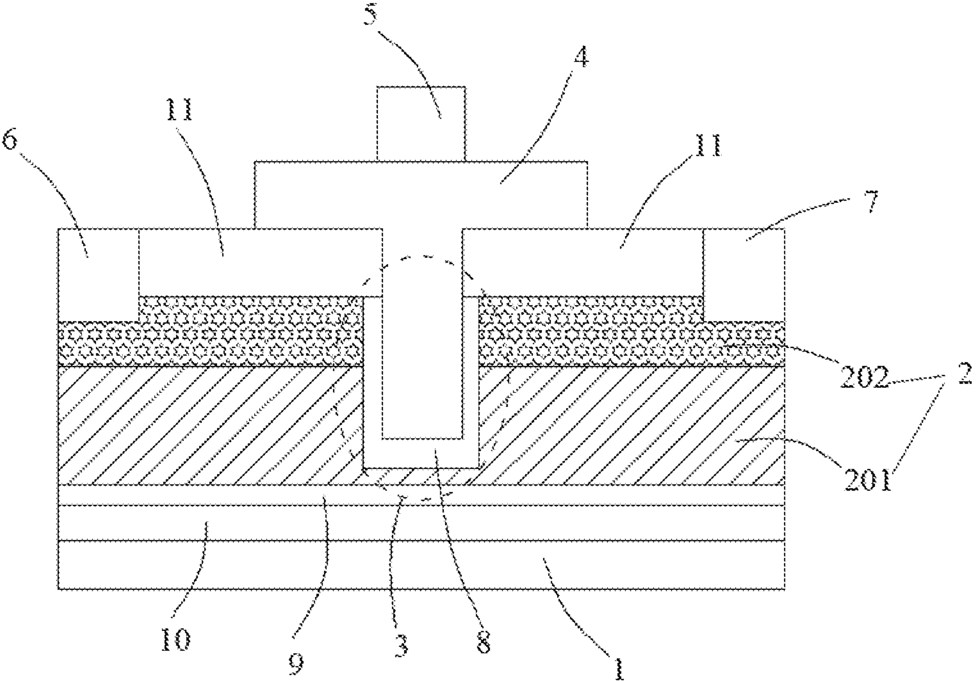
FIG. 8 is a schematic diagram of an enhancement mode switching device according to embodiment 6 of the present disclosure.

FIG. 8 is a schematic diagram of an enhancement mode switching device according to embodiment 6 of the present disclosure. A manufacturing method of the enhancement mode switching device and an enhancement mode switching device according to embodiment 6 of the present disclosure is substantially the same as the manufacturing method of the enhancement mode switching device and the enhancement mode switching device according to any one of embodiments 1 to 4 of the present disclosure, except that the enhancement mode switching device may further include a cap layer 11. The cap layer 11 is provided on the side of the barrier layer 202 far away from the substrate 1, and the cap layer 11 is provided with an opening connecting with the trench 3. The cap layer 11 may be formed integrally with the n-type semiconductor layer 8, that is, the cap layer 11 may be formed simultaneously with the n-type semiconductor layer 8 by a process of one step. In addition, the n-type ion doping concentration in the cap layer 11 is lower than that in the n-type semiconductor layer 8.

Embodiment 7

Figure 9:
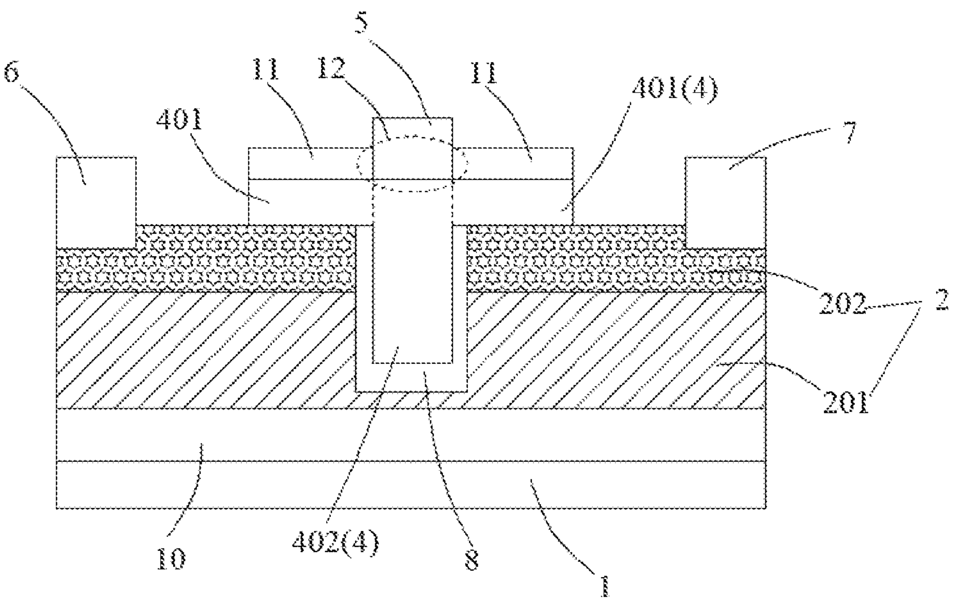
FIG. 9 is a schematic diagram of an enhancement mode switching device according to embodiment 7 of the present disclosure.

FIG. 9 is a schematic diagram of an enhancement mode switching device according to embodiment 7 of the present disclosure. A manufacturing method of the enhancement mode switching device and an enhancement mode switching device according to embodiment 7 of the present disclosure is substantially the same as the manufacturing method of the enhancement mode switching device and the enhancement mode switching device according to any one of embodiments 1 to 4 of the present disclosure, except that the enhancement mode switching device may further include a cap layer 11. The cap layer 11 is provided on the side of the p-type semiconductor layer 4 far away from the substrate 1, and has a through-hole 12 corresponding to the trench 3. The p-type semiconductor layer 4 includes a first part 401 and a second part 402. The second part 402 is a part of the p-type semiconductor layer 4 corresponding to the through-hole 12, and the first part 401 is another part of the p-type semiconductor layer 4. The second part 402 is in an active state and the first part 401 is in a passive state.

Embodiment 8

Figure 10:
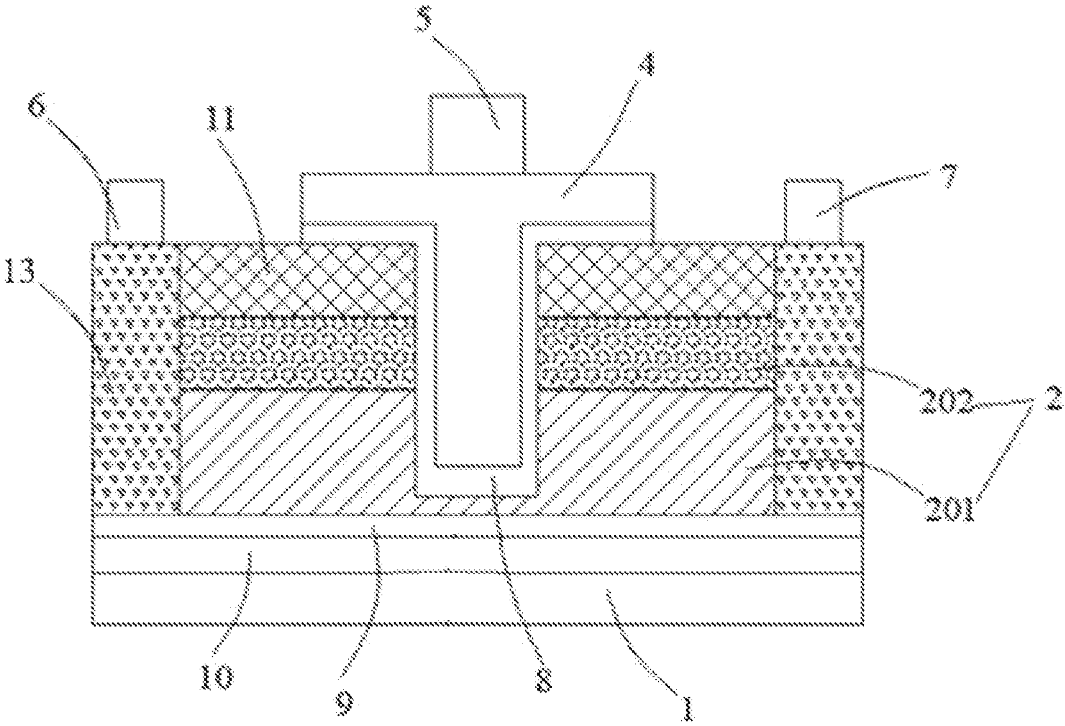
FIG. 10 is a schematic diagram of an enhancement mode switching device according to embodiment 8 of the present disclosure.

FIG. 10 is a schematic diagram of an enhancement mode switching device according to embodiment 8 of the present disclosure. A manufacturing method of the enhancement mode switching device and an enhancement mode switching device according to embodiment 8 of the present disclosure is substantially the same as the manufacturing method of the enhancement mode switching device and the enhancement mode switching device according to any one of embodiments 1 to 7 of the present disclosure, except that the enhancement type switching device may further include a heavily doped n-type nitride semiconductor 13, which is disposed in the source region and the drain region; for the source region, the heavily doped n-type nitride semiconductor 13 is disposed between the source electrode 6 and the channel structure 2; for the drain region, the heavily doped n-type nitride semiconductor 13 is disposed between the drain electrode 7 and the channel structure 2; the heavily doped n-type nitride semiconductor 13 covers the side walls of the channel structure 2, thereby, the contact resistance between the source and drain electrodes and the channel structure 2 is further reduced.

Embodiment 9

Figure 11:
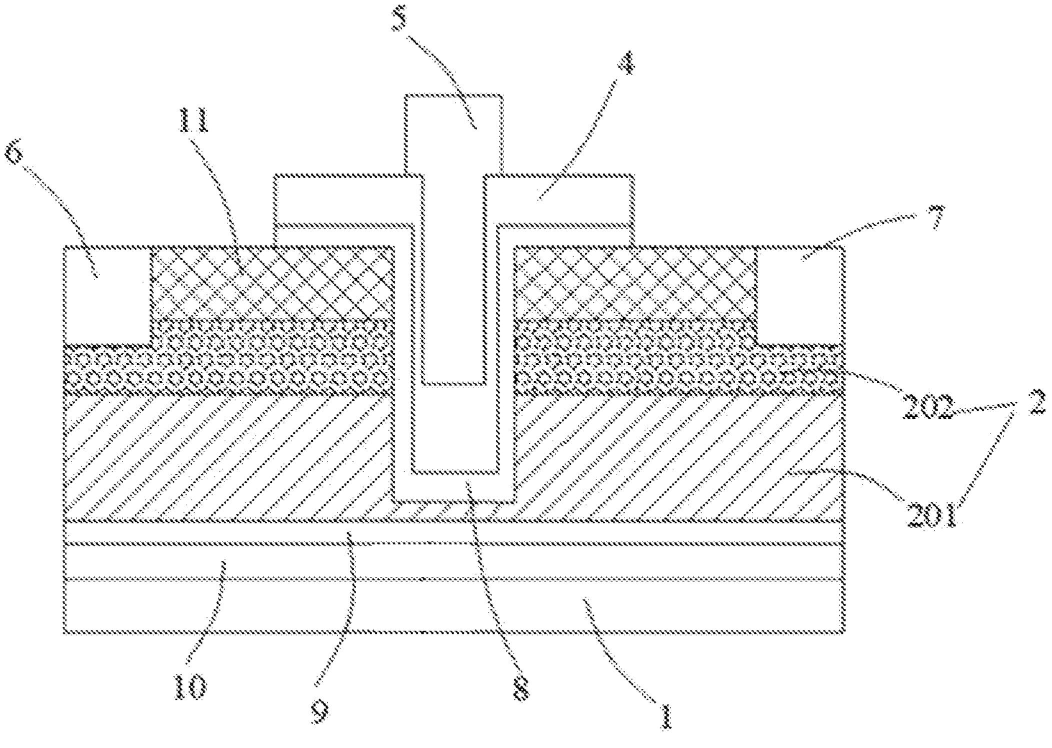
FIG. 11 is a schematic diagram of an enhancement mode switching device according to embodiment 9 of the present disclosure.

FIG. 11 is a schematic diagram of an enhancement mode switching device according to embodiment 8 of the present disclosure. A manufacturing method of the enhancement mode switching device and an enhancement mode switching device according to embodiment 9 of the present disclosure is substantially the same as the manufacturing method of the enhancement mode switching device and the enhancement mode switching device according to any one of embodiments 1 to 8 of the present disclosure, except that the p-type semiconductor layer 4 is conformally provided in the trench 3 and does not fully fill the trench.

The above is only the preferred embodiment of the present disclosure, and does not limit the present disclosure in any form. Although the present disclosure has been disclosed in the preferred embodiment, it is not intended to limit the present disclosure. Any person skilled in the art, without departing from the scope of the technical solution of the present disclosure, any simple modification, equivalent change and modification made to the above embodiments according to the technical essence of the disclosure without departing from the content of the technical solution of the disclosure still falls within the scope of the technical solution of the disclosure.

What is claimed is:

1. An enhancement mode switching device, comprising:

a substrate;

a channel structure, comprising a channel layer and a barrier layer, wherein the channel layer is provided on the substrate, and the barrier layer is provided on a side of the channel layer far away from the substrate; a side of the channel structure far away from the substrate is provided with a trench, the trench penetrates through the barrier layer and a part of the channel layer; the channel structure comprises a source region, a drain region, and a gate region between the source region and the drain region; and the trench is located in the gate region;

a p-type semiconductor layer in the gate region, wherein at least part of the p-type semiconductor layer is located in the trench and is in contact with the channel layer;

a gate electrode, located on a side of the p-type semiconductor layer far away from the substrate;

a source electrode, located in the source region;

a drain electrode, located in the drain region;

an n-type semiconductor layer, covering a bottom wall of the trench, wherein the p-type semiconductor layer is provided on the n-type semiconductor layer; and a cap layer, wherein the cap layer is provided on a side of the barrier layer far away from the substrate, the cap layer is provided with an opening connecting with the trench, the cap layer and the n-type semiconductor layer are integrally formed, and an n-type ions doping concentration in the cap layer is lower than an n-type ions doping concentration in the n-type semiconductor layer.

2. The enhancement mode switching device according to claim 1, wherein the channel layer is an n-type semiconductor; or, a part of the channel layer exposed by the trench is an n-type semiconductor.

3. The enhancement mode switching device according to claim 1, wherein the n-type semiconductor layer additionally covers sidewalls of the trench.

4. The enhancement mode switching device according to claim 1, wherein a material of the n-type semiconductor layer is selected from one or more of n-type GaN, n-type AlGaN or n-type InGaN.

5. The enhancement mode switching device according to claim 1, wherein a doping concentration of p-type doped ions in the p-type semiconductor layer is varied, and a variation pattern of the doping concentration of the p-type doped ions varying from bottom to up comprises one of or a combination of two or more of the following variation patterns: gradual increasing, gradual decreasing, stepwise increasing, stepwise decreasing, or periodic changing.

6. The enhancement mode switching device according to claim 1, wherein a material of the p-type semiconductor layer is selected from one or more of p-type GaN, p-type AlGaN or p-type InGaN.

7. The enhancement mode switching device according to claim 1, wherein the p-type semiconductor layer comprises at least one element with changing composition, content of the element with changing composition changes in an epitaxial direction, and a variation curve of the content of the element with changing composition in the epitaxial direction includes one of or a combination of two or more of the following variation stages: periodic variation, increasing variation or decreasing variation.

8. The enhancement mode switching device according to claim 7, wherein the p-type semiconductor layer comprises a periodic structure, and the periodic structure comprises at least one period stacked in sequence along the epitaxial direction, wherein each of the at least one period includes a first periodic layer and a second periodic layer that are sequentially stacked along the epitaxial direction; and the content of the element with changing composition increases uniformly in the first periodic layer and decreases uniformly in the second periodic layer;

the content of the element with changing composition decreases uniformly in the first periodic layer and increases uniformly in the second periodic layer;

a first content of the element with changing composition is constant in the first periodic layer, and a second content of the element with changing composition is constant in the second periodic layer, wherein the first content is higher or lower than the second content;

the content of the element with changing composition increases uniformly in the first periodic layer and is constant in the second periodic layer; or the content of the element with changing composition decreases uniformly in the first periodic layer and is constant in the second periodic layer.

9. The enhancement mode switching device according to claim 1, wherein the trench comprises a plurality of discrete sub-trenches.

10. The enhancement mode switching device according to claim 1, wherein a part of the p-type semiconductor layer covers a part of the channel structure outside the trench, wherein the cap layer is also provided on a side of the p-type semiconductor layer far away from the substrate, the cap layer has a through-hole corresponding to the trench, a region of the p-type semiconductor layer corresponding to the through-hole is in an active state, and an other region of the p-type semiconductor layer is in a passive state.

11. A method of manufacturing the enhancement mode switching device according to claim 1, comprising:

providing the substrate;

forming the channel structure, wherein the channel structure comprises the channel layer and the barrier layer, the channel layer is provided on the substrate and the barrier layer is provided on the side of the channel layer far away from the substrate; the channel structure comprises the source region, the drain region, and the gate region between the source region and the drain region;

providing the trench on the side of the channel structure far away from the substrate, the barrier layer and the part of the channel layer are penetrated through by the trench; the trench is located in the gate region;

forming the p-type semiconductor layer in the gate region, wherein at least the part of the p-type semiconductor layer is in the trench;

forming the gate electrode on the side of the p-type semiconductor layer far away from the substrate;

forming the source electrode in the source region; and forming the drain electrode in the drain region;

before forming the gate electrode, the method further comprises:

forming the n-type semiconductor layer and the cap layer simultaneously by a process of one step, wherein the n-type semiconductor layer covers the bottom wall of the trench or the n-type semiconductor layer covers the bottom wall and side walls of the trench, the p-type semiconductor layer is provided on the n-type semiconductor layer, the cap layer is provided on the side of the barrier layer far away from the substrate, the cap layer is provided with the opening connecting with the trench, an n-type ions doping concentration in the cap layer is lower than an n-type ions doping concentration in the n-type semiconductor layer.

12. The method of manufacturing enhancement mode switching device according to claim 11, wherein a region of the p-type semiconductor layer covers a region of the channel structure outside the trench, the method further comprises:

activating a region of the p-type semiconductor layer corresponding to the trench and passivating an other region of the p-type semiconductor layer; and wherein the cap layer is formed on the side of the p-type semiconductor layer far away from the substrate, wherein the cap layer has a through-hole corresponding to the trench to expose the region of the p-type semiconductor layer in an active state.

* * * * *